(12) United States Patent
Takaoka

(10) Patent No.: US 6,653,660 B2
(45) Date of Patent: Nov. 25, 2003

(54) VERTICAL CAVITY-TYPE SEMICONDUCTOR LIGHT-EMITTING DEVICE AND OPTICAL MODULE USING VERTICAL CAVITY-TYPE SEMICONDUCTOR LIGHT-EMITTING DEVICE

(75) Inventor: Keiji Takaoka, Kawasaki (JP)

(73) Assignee: Kabushiki Kaisha Toshiba, Toyko (JP)

( * ) Notice: Subject to any disclaimer, the term of this patent is extended or adjusted under 35 U.S.C. 154(b) by 22 days.

(21) Appl. No.: 09/960,330

(22) Filed: Sep. 24, 2001

(65) Prior Publication Data

US 2002/0038869 A1 Apr. 4, 2002

(30) Foreign Application Priority Data

Sep. 29, 2000 (JP) ......................... 2000-299425

(51) Int. Cl.[7] .................... H01L 29/26; H01L 27/15; H01L 31/12; H01L 33/00; H01L 29/22; H01L 29/227; H01L 29/24; H01L 29/20; H01L 31/0304; H01L 23/58; H01S 5/00

(52) U.S. Cl. ...................... 257/98; 257/79; 257/99; 257/100; 257/103; 257/615; 257/631; 257/632; 257/633

(58) Field of Search .................. 257/79, 98, 99, 257/100, 103, 615, 631, 632, 633; 372/43

(56) References Cited

U.S. PATENT DOCUMENTS 5,428,634 A * 6/1995 Bryan et al. ............... 372/45
6,051,848 A * 4/2000 Webb ......................... 257/99

FOREIGN PATENT DOCUMENTS

JP  2000-164982  6/2000

* cited by examiner

Primary Examiner—Nathan J. Flynn
Assistant Examiner—Victor A. Mandala, Jr.
(74) Attorney, Agent, or Firm—Oblon, Spivak, McClelland, Maier & Neustadt, P.C.

(57) ABSTRACT

A vertical cavity-type semiconductor light-emitting device comprises a first semiconductor distributed Bragg reflector type mirror formed on a substrate, a first semiconductor layer formed on the first semiconductor distributed Bragg reflector type mirror and including at least an active layer which becomes an emission layer, a second semiconductor distributed Bragg reflector type mirror formed on the first semiconductor layer and including Al as a configuration element, and a second semiconductor layer including $In_xGa_{1-x}P$ ($0 \leq x \leq 1$) layer provided on the second semiconductor distributed Bragg reflector type mirror.

21 Claims, 7 Drawing Sheets

VERTICAL CAVITY-TYPE SEMICONDUCTOR LIGHT-EMITTING DEVICE AND OPTICAL MODULE USING VERTICAL CAVITY-TYPE SEMICONDUCTOR LIGHT-EMITTING DEVICE

CROSS-REFERENCE TO RELATED APPLICATIONS

This application is based upon and claims the benefit of priority from the prior Japanese Patent Application No. 2000-299425, filed Sep. 29, 2000, the entire contents of which are incorporated herein by reference.

BACKGROUND OF THE INVENTION

1. Field of the Invention

The present invention relates to a vertical cavity-type semiconductor light-emitting device which emits a light vertical to a main surface of a substrate and an optical module using a vertical cavity-type semiconductor light-emitting device and resin molding.

2. Description of the Related Art

A resonant-cavity light-emitting diode (Hereinafter, described as an RCLED (Resonant-Cavity Light-Emitting Diode)) has a similar structure to a vertical-cavity surface-emitting laser (Hereinafter, described as a VCSEL (Vertical-Cavity Surface-Emitting Laser)). The RCLED can operate in an LED mode by setting reflectivity on the light emission-side low and suppressing laser oscillation. The RCLED has the following features by the effect of the resonator structure compared with the usual LED.

1) A line width of an emission spectrum is narrow.
2) A directivity of the output light is high.
3) A carrier lifetime of a spontaneous emission is short. Therefore, the RCLED is very suitable as the transmission light source for an optic LAN and an optical data link compared with the usual LED, and performs an important role at the transmission ratio of especially about 100 Mbps to 1 Gbps.

FIG. 1 shows a structural sectional view of a conventional RCLED emitting at wavelength regions around 660 nm. The RCLED shown in FIG. 1 has substantially the same configuration as that shown in IEEE PHOTONICS TECHNOLOGY LETTERS, VOL. 10, NO. 12, PP. 1685–1687. The RCLED shown in FIG. 1 has a structure in which an N-type GaAs buffer layer 108, an AlGaAs-based n-type distributed Bragg reflector type mirror 107 (Hereinafter, the distributed Bragg reflector type mirror is described as a "DBR (Distributed Bragg Reflector) mirror"), an N-type InGaAlP clad layer 106, an InGaAlP-based MQW (Multi Quantum Well) active layer 105, an p-type InGaAlP clad layer 104, an AlGaAs-based p-type DBR mirror 103, and a p-type GaAs contact layer 102 are accumulated one by one on an n-type GaAs substrate 109. The current injection into the active layer is performed by a the p-side electrode 101 which has an opening for the light emission and an n-side electrode 110 provided on the entire back surface of the substrate. The current confinement to the emission region is performed by the high resistance semiconductor area 111 formed by using proton implantation. The current confinement size is about a diameter of 50 to 100 μm. The DBR mirror comprises a structure in which an $Al_{0.98}Ga_{0.02}As$ low refractive index layers and an $Al_{0.5}Ga_{0.5}As$ high refractive index layers are alternately accumulated. The number of repetitions of accumulation is 30.5 (reflectivity about 99%) on the n-side and 10 (reflectivity about 90%) on the p-side.

In the vertical cavity-type light-emitting device whose emission wavelength is in a red wavelength region as mentioned above, to make the DBR mirror transparent for the emission wavelength, it is necessary to use AlGaAs whose Al composition is higher than 0.5 for both the low refractive index layer and the high refractive index layer. Furthermore, it is preferable to enlarge a difference of the refractive index between the low refractive index layer and the high refractive index layer as much as possible in order to widen the width of the high reflection band region of the DBR mirror sufficiently. Therefore, it is general that the Al composition assumes to be 1 or a value close to 1 in the low refractive index layer.

On the other hand, when making an optical transmission module using the light-emitting device like the RCLED, the resin molding or the hermetic sealing to the can package is used to protect the semiconductor light-emitting device. It becomes possible to be a small module with low-price by using the resin molding. However, the resin which is generally used has the problem in the humidity resistance. Therefore, it is difficult to manufacture the module with high reliability using the resin molding. Especially, in the vertical cavity-type semiconductor light-emitting device using AlGaAs in which the Al composition is high as mentioned above in the vicinity of the element surface, it is very difficult to manufacture the module with high reliability by the resin molding, since the degradation of the AlGaAs layer by moisture absorption is remarkable.

As described above, in a conventional vertical cavity-type semiconductor light-emitting device, since AlGaAs whose Al composition is high is used near the surface of the element, the degradation of the device by moisture absorption is very remarkable. Therefore, it is necessary to use not the resin molding but the hermetic sealing to create the module with high reliability. Therefore, the low price and the miniaturization of the module are difficult. Especially, when AlGaAs whose Al composition exceeds 0.5 is used, the degradation of the light-emitting device by the moisture absorption is very remarkable.

BRIEF SUMMARY OF THE INVENTION

An object of the present invention is to provide a light-emitting device with high reliability.

The vertical cavity-type semiconductor light-emitting device according to an embodiment of the present invention is characterized by comprising: a first semiconductor distributed Bragg reflector type mirror formed on a substrate; a first semiconductor layer formed on the first semiconductor distributed Bragg reflector type mirror and including an active layer which at least becomes an emission layer; a second semiconductor distributed Bragg reflector type mirror formed on the first semiconductor layer and including Al as a configuration element; and a second semiconductor layer including $In_xGa_{1-x}P$ ($0 \leq X \leq 1$) layer provided on the second semiconductor distributed Bragg reflector type mirror.

DETAILED DESCRIPTION OF THE INVENTION

Figure 1:
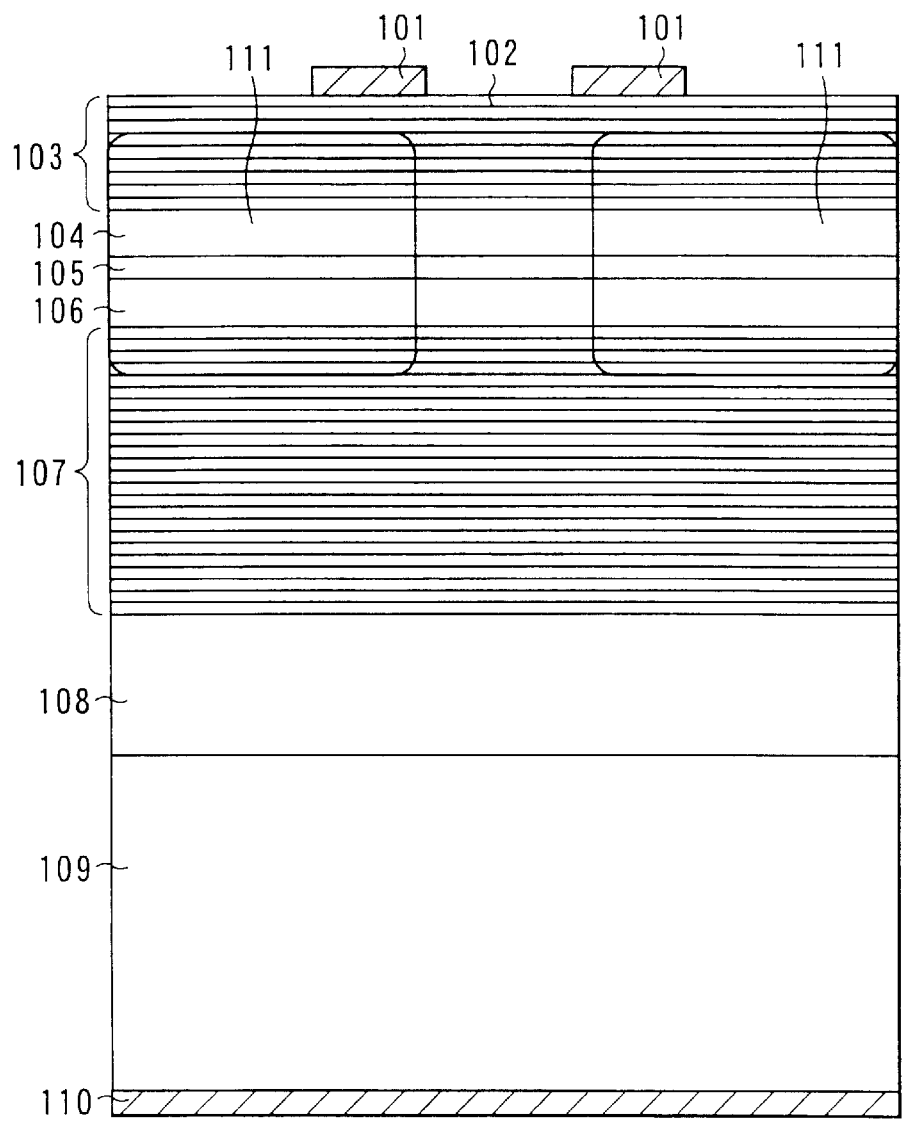
FIG. 1 is a sectional view which shows an outline configuration of a vertical cavity-type semiconductor light-emitting device of the conventional art.

Hereinafter, embodiments of the present invention will be explained referring to the drawings.
(First Embodiment)

Figure 2:
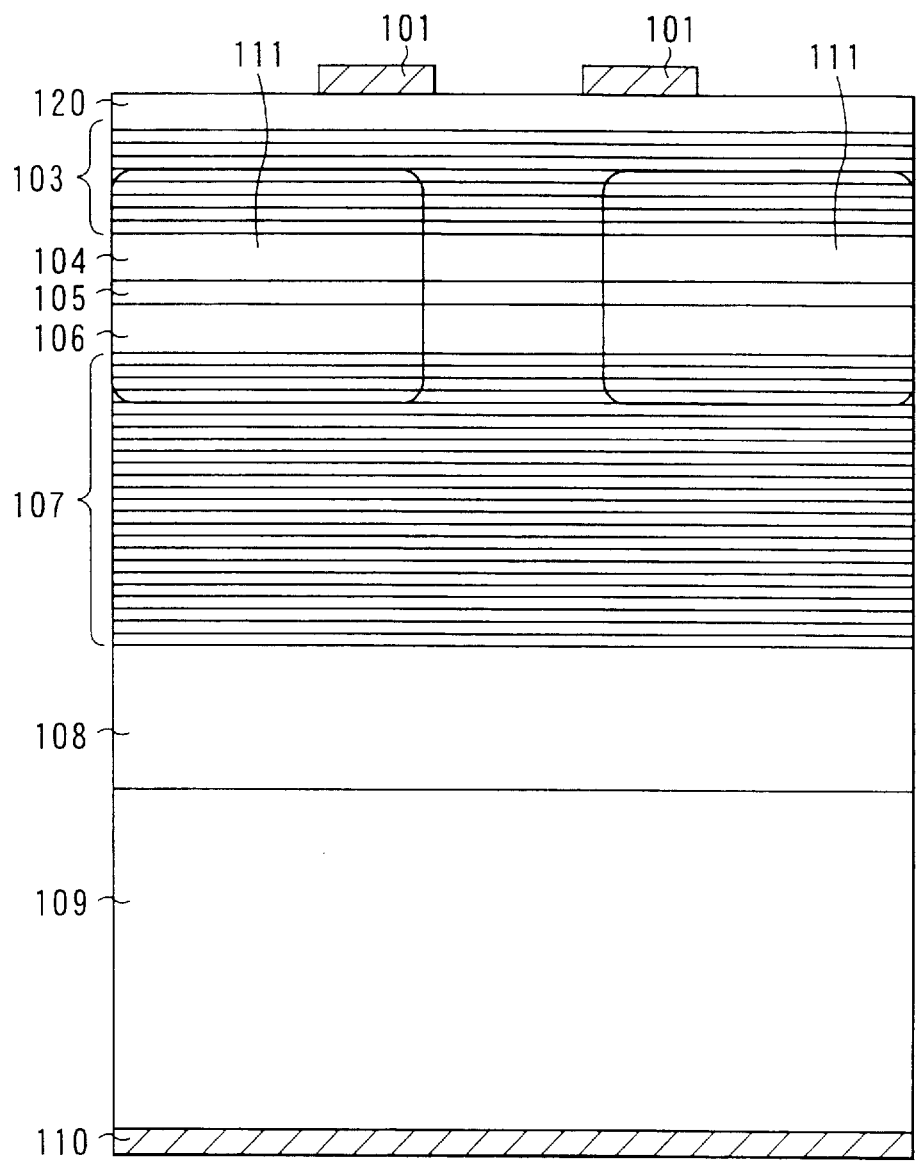
FIG. 2 is a sectional view which shows a configuration of a vertical cavity-type semiconductor light-emitting device according to the first embodiment of the present invention.
Figure 3:
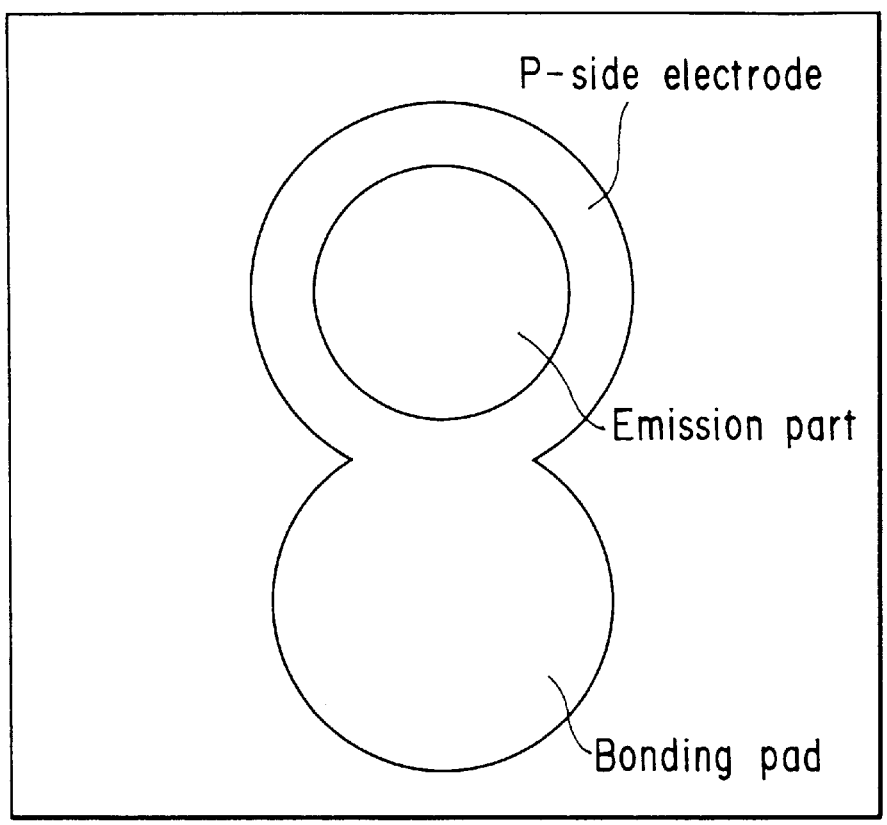
FIG. 3 is a schematic view when the device shown in FIG. 2 is shown from upper side.

FIG. 2 is sectional view which shows a configuration of a vertical cavity-type semiconductor light-emitting device according to the first embodiment of the present invention. FIG. 3 is a schematic view when the device of FIG. 2 is shown from upper side. In the first embodiment, the red RCLED whose active layer consists of InGaAlP-based multi-quantum well (MQW) structure and whose emission wavelength is about 665 nm will be explained.

First, an n-type GaAs buffer layer 108, an AlGaAs-based n-type DBR mirror 107, an n-type InGaAlP clad layer 106, an InGaAlP-based MQW active layer 105, a p-type InGaAlP clad layer 104, an AlGaAs-based p-type DBR mirror 103, and a p-type InGaP wetproof layer 120 which acts the protection layer from the moisture absorption are grown on an n-type GaAs substrate 109 one by one by using the MOCVD method. The InGaAlP-based MQW active layer 105 is adjusted for the photo-luminescence peak wavelength to become 655 nm. At this time, the AlGaAs-based DBR mirror has the structure that $Al_{0.98}Ga_{0.02}As$ (low refractive index layer) and $Al_{0.5}Ga_{0.5}As$ (high refractive index layer) are alternately sequentially accumulated, and the optical film thickness of each layer is set to be ¼ wavelength of the resonance wavelength (665 nm). An n-side DBR mirror has the structure that the number of repetitions thereof is 30.5 from starting accumulation of $Al_{0.98}Ga_{0.02}As$ (final layer is $Al_{0.98}Ga_{0.02}As$). A p-side DBR mirror has the structure that the number of repetitions thereof is 10 from starting accumulation of $Al_{0.98}Ga_{0.02}As$ (final layer is $Al_{0.05}Ga_{0.5}As$). The resonance wavelength of the optical cavity structure which is constructed by the upper and lower DBR mirrors is adjusted to become about 665 nm. Next, the high resistance area 111 is selectively formed by proton implantation except a round area of 70 μm in the diameter which becomes an emission area. At this time, the acceleration voltage of the proton implantation is assumed to be 200 kV, and the amount of the dose is $5 \times 10^{14}/cm^2$. Next, the device is completed by forming the p-side electrode 101, polishing the back surface, and forming the n-side electrode 110. At this time, a round opening of 60 μm in the diameter is provided on the emission area in the p-side electrode 101. The carrier concentration of the p-type InGaP wetproof layer 120 is about $5 \times 10^{18}/cm^3$ and thickness thereof is about 0.2 μm.

The p-side electrode of the element manufactured as described above has a ring shape whose inside diameter is 60 μm and outside diameter thereof is 80 μm as showing in FIG. 3. The inside of the ring of the p-side electrode becomes an emission part, and the light is emitted in a direction vertical to the substrate. A bonding pad of 75 μm in diameter is arranged adjacent to the p-side electrode and is connected with the p-side electrode, and the current can be injected into the RCLED by connecting the bonding pad with an external circuit through the lead (not shown in the figure).

The final semiconductor layer on the surface of the RCLED manufactured as described above is InGaP. In the first embodiment, $Al_{0.98}Ga_{0.02}As$ and $Al_{0.5}Ga_{0.5}As$ that the wetproofing is bad for the DBR mirror are used. However, moisture can be prevented being infiltrated since the DBR mirror is protected with the InGaP layer which is excellent in the wetproofing. Therefore, the device with high reliability can be obtained. When the resin molding is performed to the created device, and high temperature wetproof test is performed in the condition of 60° C. in temperature and 90% in humidity, extremely excellent results in which the lowering of an optical output after passing 5,000 hours is 0.5 dB or less can be obtained.

It is preferable to set that the total optical film thickness of InGaP wetproof layer and $Al_{0.5}Ga_{0.5}As$ DBR final layer becomes the odd number times of ¼ wavelength of the resonance wavelength (665 nm). As a result, it becomes an ideal design so that the surface of the element is located just in the antinode of the standing wave which is formed with the resonator, and an optical output becomes maximum.
(Second Embodiment)

Figure 4:
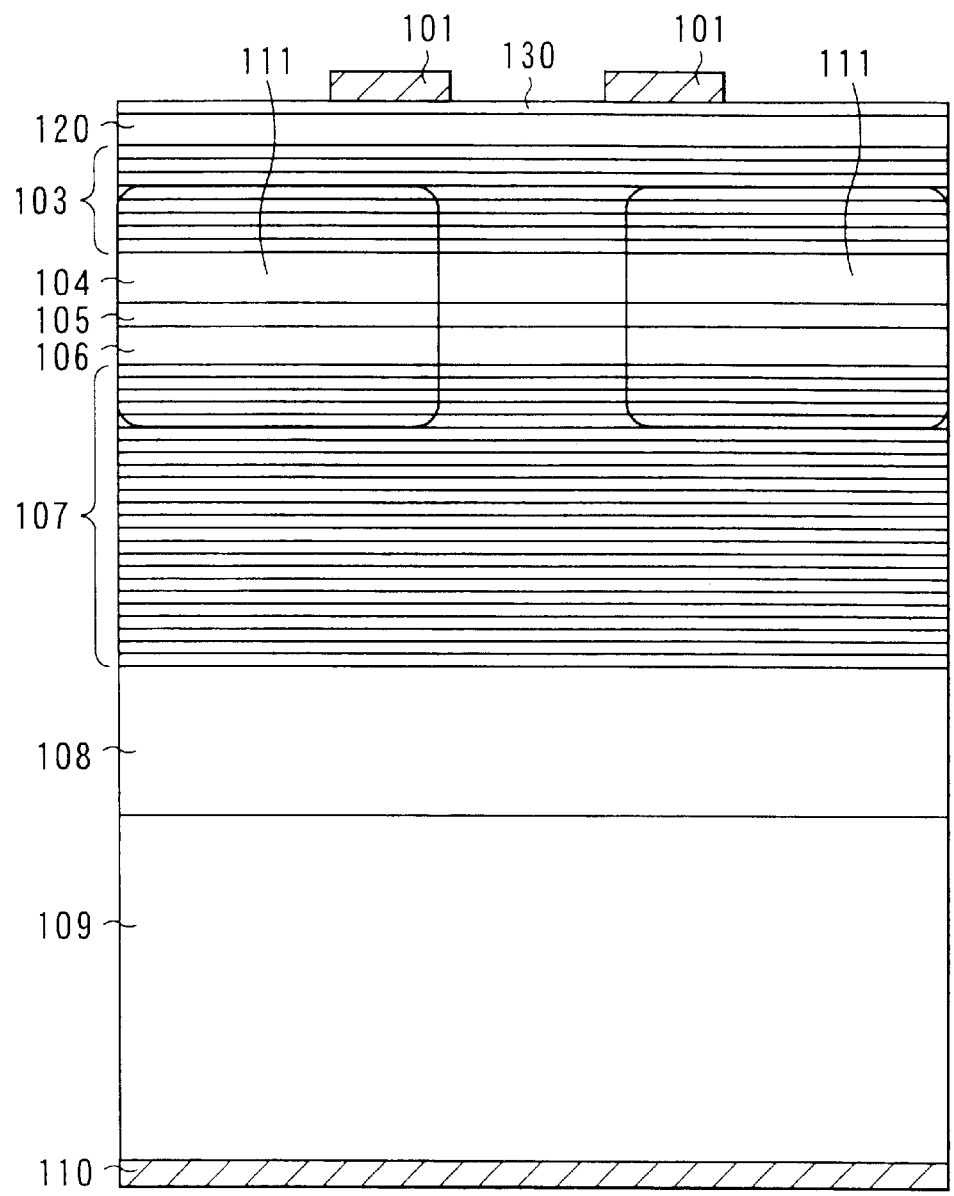
FIG. 4 is a sectional view which shows a configuration of a vertical cavity-type semiconductor light-emitting device according to the second embodiment of the present invention.

FIG. 4 is a sectional view which shows a configuration of a vertical cavityresonator-type semiconductor light-emitting device according to the second embodiment of the present invention. In each following embodiment, since a top view is the same as the first embodiment, drawings and explanation will be omitted. The vertical cavity-type semiconductor light-emitting device according to the second embodiment is a red RCLED whose active layer consists of InGaAlP-based multiple quantum well (MQW) structure and an emission wavelength is about 665 nm as well as the first embodiment. In FIG. 4, the same mark is fixed to the same part as FIG. 2.

First, an n-type GaAs buffer layer 108, an AlGaAs-based n-type DBR mirror 107, an n-type InGaAlP clad layer 106, an InGaAlP-based MQW active layer 105, a p-type InGaAlP clad layer 104, an AlGaAs-based p-type DBR mirror 103, a p-type InGaP wetproof layer 120, and a p-type GaAs contact layer 130 are grown on an n-type GaAs substrate 109 one by one by using the MOCVD method. The InGaAlP-based MQW active layer 105 is adjusted for the photo-luminescence peak wavelength to become 655 nm. At this time, the AlGaAs-based DBR mirror has the structure that the $Al_{0.98}Ga_{0.02}As$ and $Al_{0.5}Ga_{0.5}As$ whose optical film thickness is ¼ wavelength of the resonance wavelength (665 nm) are alternately accumulated. The n-side DBR mirror has the structure that the number of repetitions thereof is 30.5 from starting accumulation of $Al_{0.98}Ga_{0.02}As$ (final layer is $Al_{0.98}Ga_{0.02}As$). The p-side DBR mirror has the structure that the number of repetitions thereof is 10 from starting accumulation of $Al_{0.98}Ga_{0.02}As$ (final layer is $Al_{0.5}Ga_{0.5}As$). The resonance wavelength of the optical cavity structure which is constructed by the upper and lower DBR mirrors layer is adjusted to become about 665 nm. Next, high resistance area 111 is selectively formed by proton implantation except a round area of 70 μm in the diameter which becomes an emission area. At this time, the acceleration voltage of the proton implantation is assumed to be 200 kV, and the amount of dose is assumed to be $5 \times 10^{14}/cm^2$. Next, the device is completed by forming the p-side electrode 101, polishing the back surface, and forming the n-side electrode 110. At this time, a round opening of 60 μm in the diameter is provided on the emission area in p-side electrode 110. The carrier concentration of p-type InGaP wetproof layer 102 is about $5 \times 10^{18}/cm^3$, and thickness thereof is about 0.2 μm. To reduce the optical loss by absorption enough, the thickness of p-type GaAs contact layer 130 is assumed to be about 5 nm.

The reliability of the RCLED manufactured as described above is extremely high because of the effect of the InGaP wetproof layer as well as the case of the first embodiment. In the second embodiment, since the p-type GaAs contact layer 130 is used, it becomes possible to form very low resistance ohmic contact. Therefore, the resistance of the RCLED is very small and high-speed operation can be performed even if the area of the electrode is very reduced to reduce the capacitance of the device.

(Third Embodiment)

Figure 5:
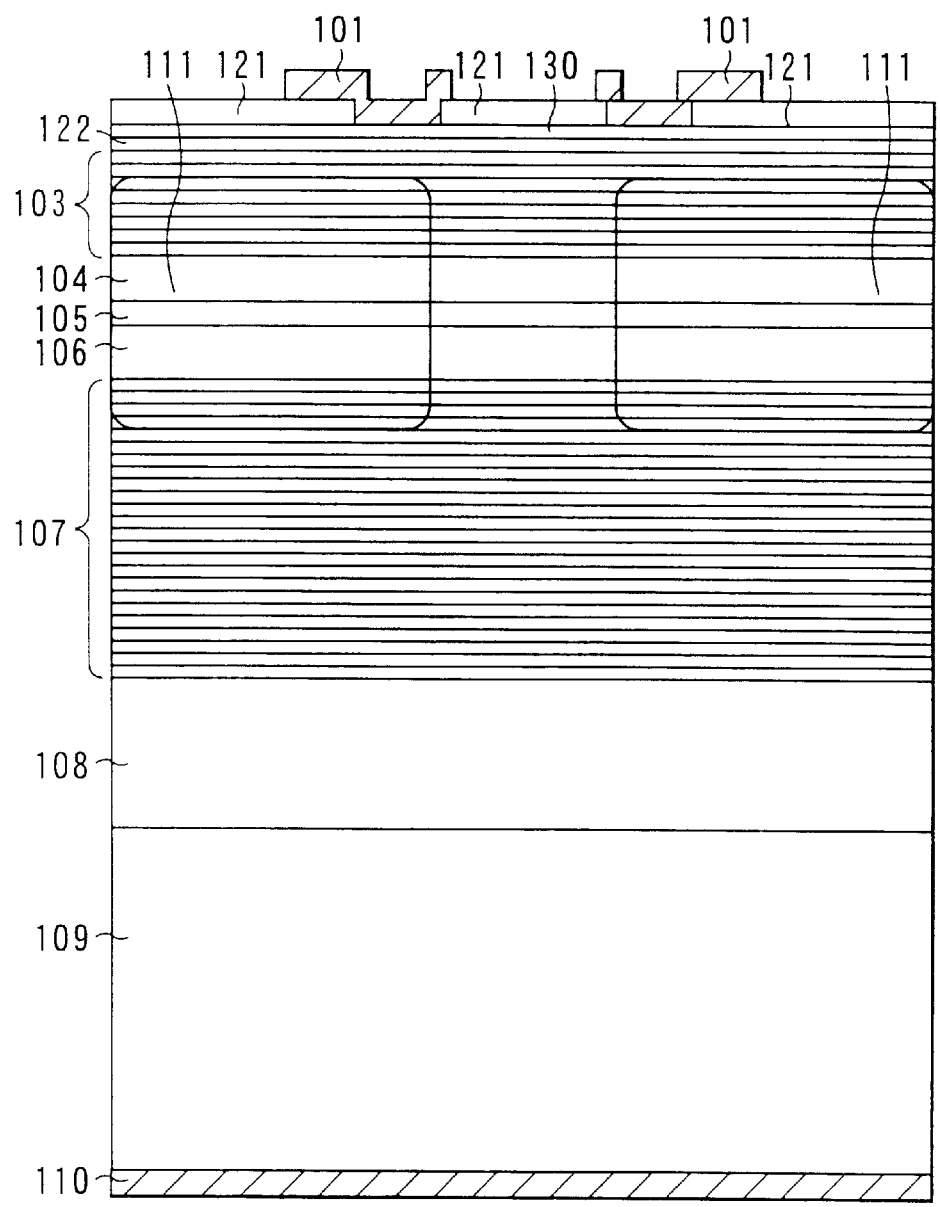
FIG. 5 is a sectional view which shows a configuration of a vertical cavity-type semiconductor light-emitting device according to the third embodiment of the present invention.

FIG. 5 is a sectional view which shows a configuration of a vertical cavity-type semiconductor light-emitting device according to the third embodiment of the present invention. The vertical cavity-type semiconductor light-emitting device according to the third embodiment is a red RCLED whose active layer consists of InGaAlP-based multiple quantum well (MQW) structure and an emission wavelength is about 665 nm as well as the first embodiment. In FIG. 5, the same mark is fixed to the same part as FIG. 2.

First, an n-type GaAs buffer layer 108, an AlGaAs-based n-type DBR mirror 107, an n-type InGaAlP clad layer 106, an InGaAlP-based MQW active layer 105, a p-type InGaAlP clad layer 104, an AlGaAs-based series p-type DBR mirror 103, a p-type InGaP wetproof layer 122, a p-type GaAs contact layer 130 and a p-type InGaP wetproof layer 121 are grown on an n-type GaAs substrate 109 one by one by using the MOCVD method. The InGaAlP-based MQW active layer 105 is adjusted for the photo-luminescence peak wavelength to become 655 nm. At this time, the AlGaAs-based DBR mirror has the structure that the $Al_{0.98}Ga_{0.02}As$ and $Al_{0.5}Ga_{0.5}As$ whose optical film thickness is ¼ wavelength of the resonance wavelength (665 nm) are alternately accumulated. The n-side DBR mirror has the structure that the number of repetitions thereof is 30.5 from starting accumulation of $Al_{0.98}Ga_{0.02}As$ (final layer is $Al_{0.98}Ga_{0.02}As$). The p-side DBR mirror has the structure that the number of repetitions thereof is 10 from starting accumulation of $Al_{0.98}Ga_{0.02}As$ (final layer is $Al_{0.5}Ga_{0.5}As$). In addition, the total optical film thickness of the p-type InGaP, the wetproof layer 122, the p-type GaAs, the contact layer 130, and the p-type InGaP wetproof layer 121 is adjusted to become ½ wavelength of the resonance wavelength (665 nm). The thickness of the GaAs contact layer is assumed to be 10 nm, and two InGaP wetproof layers are set in the same thickness. The resonance wavelength of the optical cavity structure which is constructed by the upper and lower DBR mirrors is adjusted to become about 665 nm. Next, the high resistance area 111 is selectively formed by proton implantation except a round area of 70 μm in the diameter which becomes an emission area. At this time, the acceleration voltage of the ion implantation is assumed to be 200 kV, and the amount of dose is assumed to be $5 \times 10^{14}/cm^2$. Next, the p-type InGaP wetproof layer 121 is removed by selective etching in the area in which the p-side ohmic contact is taken. Next, the device is completed by forming the p-side electrode 101, polishing the back surface, and forming the n-side electrode 110. At this time, a round opening of 60 μm in the diameter is provided on the emission area in p-side electrode 301.

(Fourth Embodiment)

Figure 6:
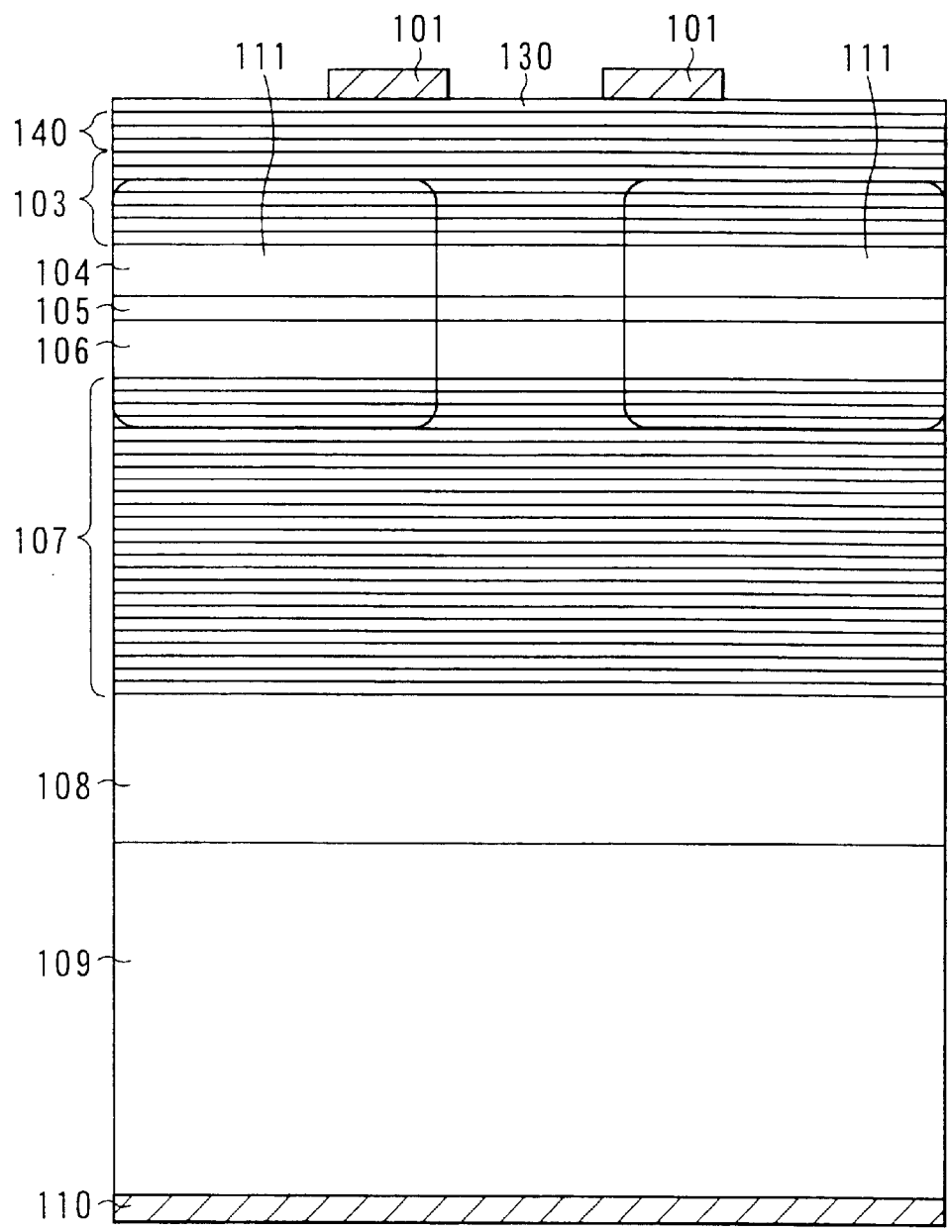
FIG. 6 is a sectional view which shows a configuration of a vertical cavity-type semiconductor light-emitting device according to the fourth embodiment of the present invention.

FIG. 6 is a sectional view which shows a configuration of a vertical cavity-type semiconductor light-emitting device according to the fourth embodiment of the present invention. The vertical cavity-type semiconductor light-emitting according to the fourth embodiment is a red RCLED whose active layer consists of InGaAlP-based multiple quantum well (MQW) structure and an emission wavelength is about 665 nm as well as the first embodiment. In FIG. 6, the same mark is fixed to the same part as FIG. 2.

First, an n-type GaAs buffer layer 108, an AlGaAs-based n-type DBR mirror 107, an n-type InGaAlP clad layer 106, an InGaAlP-based MQW active layer 105, a p-type InGaAlP clad layer 104, an AlGaAs-based p-type DBR mirror 103, a DBR final pair having Al0.98Ga0.02As/InGaP, and a p-type GaAs contact layer 130 are grown on an n-type GaAs substrate 109 one by one by using the MOCVD method. The InGaAlP-based MQW active layer 105 is adjusted for the photo-luminescence peak wavelength to become 655 nm. At this time, the AlGaAs-based DBR mirror has the structure that $Al_{0.98}Ga_{0.02}As$ and $Al_{0.5}Ga_{0.5}As$ whose optical film thickness is ¼ wavelength of the resonance wavelength (665 nm) are alternately accumulated. The n-side DBR mirror has the structure that the number of repetitions thereof is 30.5 from starting accumulation of $Al_{0.98}Ga_{0.02}As$ (final layer is $Al_{0.98}Ga_{0.02}As$). The p-side DBR mirror has the structure of accumulating $Al_{0.98}Ga_{0.02}As$/InGaP which becomes the final pair to the structure (final layer is $Al_{0.5}Ga_{0.5}As$) repeated for 9 from starting accumulation of $Al_{0.98}Ga_{0.02}As$. The resonance wavelength of the optical cavity structure which is constructed by the upper and lower DBR mirrors is adjusted to become about 665 nm. Next, the high resistance area 111 is selectively formed proton implantation except a round area of 70 μm in the diameter which becomes an emission area. At this time, the acceleration voltage of the proton implantation is assumed to be 200 kV, and the amount of dose is assumed to be $5 \times 10^{14}/cm^2$. Next, the device is completed by forming the p-side electrode 101, polishing the back surface, and forming the n-side electrode 110. At this time, a round opening of 60 μm in the diameter is provided on the emission area in the p-side electrode 101.

In the RCLED manufactured as mentioned above, the final layer of the DBR mirror does not include Al, five family element in InGaP is only P, and this layer functions as the wetproof layer. Therefore, the device with high reliability can be obtained as well as the first to third embodiments.

(Fifth Embodiment)

Figure 7:
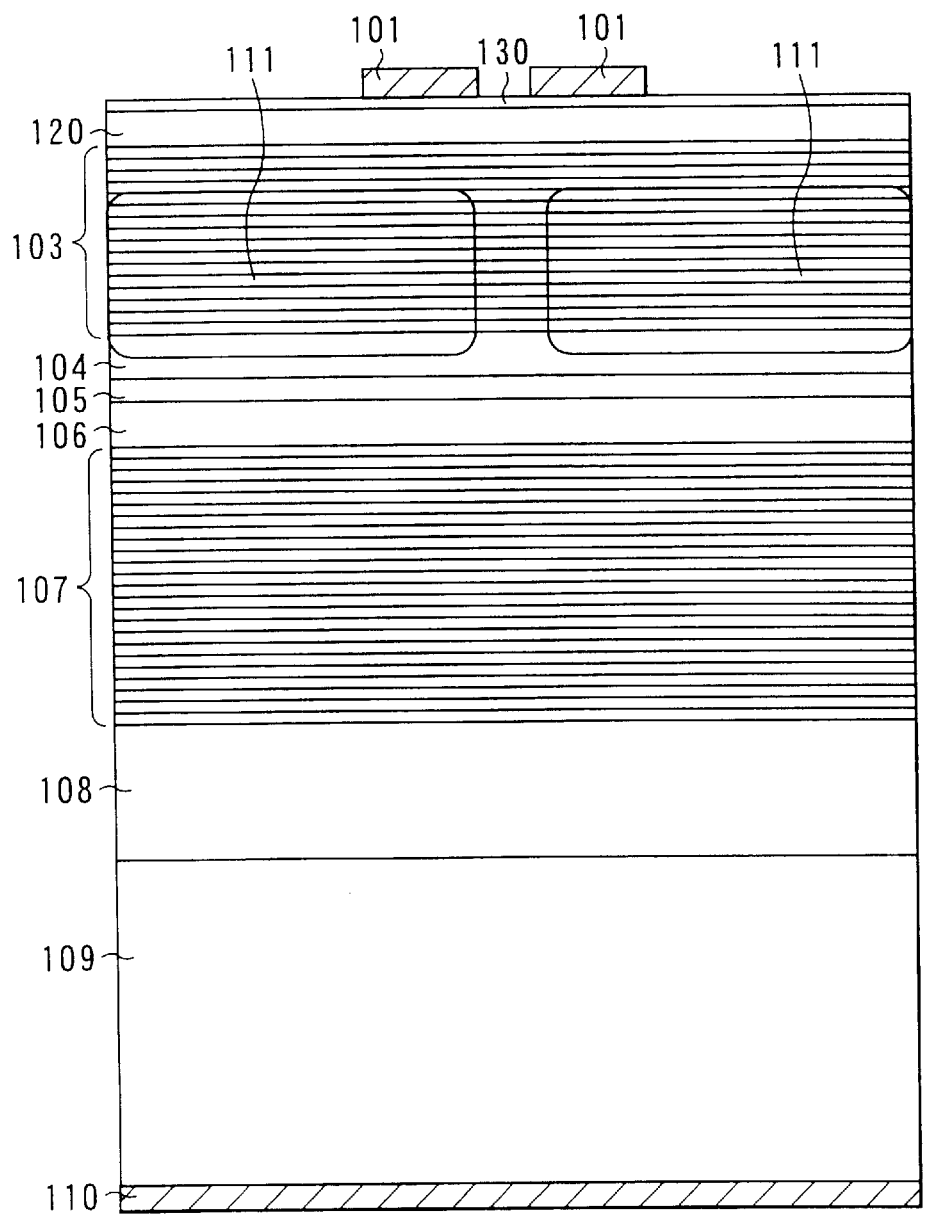
FIG. 7 is a sectional view which shows a configuration of a vertical cavity-type semiconductor light-emitting device according to the fifth embodiment of the present invention.

FIG. 7 is sectional view which shows an outline configuration of the vertical cavity-type semiconductor light-emitting device according to the fifth embodiment of the present invention. The vertical cavity-type semiconductor light-emitting device according to the fifth embodiment is a red VCSEL whose active layer consists of an InGaAlP-based multiple quantum well (MQW) structure and emission wavelength is about 665 nm unlike the first to fourth embodiment. In FIG. 7, the same mark is fixed to the same part as FIG. 2.

First, an n-type GaAs buffer layer 108, an AlGaAs-based n-type DBR mirror 107, an n-type InGaAlP clad layer 106, an InGaAlP-based MQW active layer 105, a p-type InGaAlP clad layer 104, an AlGaAs-based p-type DBR mirror 103, a p-type InGaP wetproof layer 120, and a p-type GaAs contact layer 130 are grown on an n-type GaAs substrate 109 one by one by using the MOCVD method. The InGaAlP-based MQW active layer 105 is adjusted for the photo-luminescence peak wavelength to become 655 nm. At this time, the AlGaAs-based DBR mirror has the structure that $Al_{0.98}Ga_{0.02}As$ and $Al_{0.5}Ga_{0.5}As$ whose optical film thickness is ¼ wavelength of the resonance wavelength (665 nm) are alternately accumulated. The n-side DBR mirror has the structure that the number of repetitions thereof is 50.5 from starting accumulation of $Al_{0.98}Ga_{0.02}As$ (final layer is $Al_{0.98}Ga_{0.02}As$). The p-side DBR mirror has the structure that the number of repetitions thereof is 30 from starting accumulation of $Al_{0.98}Ga_{0.02}As$ (final layer is $Al_{0.5}Ga_{0.5}As$). The resonance wavelength of the optical cavity structure which is constructed by the upper and lower DBR mirrors is adjusted to become about 665 nm. Next, the high resistance area 111 is selectively formed by proton implantation except a round area of 15 μm in the diameter which becomes an emission area. At this time, the acceleration voltage of the proton implantation is assumed to be 300 kV, and the amount of dose is assumed to be $1 \times 10^{15}/cm^2$. Next, the device is completed by forming the p-side electrode 101, polishing the back surface, and forming the n-side electrode 110. At this time, a round opening of 10 μm in the diameter is provided on the emission area in the p-side electrode 301. The carrier concentration of p-type InGaP wetproof layer 120 is about $5 \times 10^{18}/cm^3$ and thickness is about 0.2 μm. To reduce the optical loss by the absorption enough, the thickness of the p-type GaAs contact layer 130 is assumed to be about 5 nm.

In the VCSEL manufactured as described above, the final semiconductor layer on the surface of the device is InGaP. The DBR mirror is protected with an excellent InGaP layer in the wetproofing though $Al_{0.98}Ga_{0.02}As$ and $Al_{0.5}Ga_{0.5}As$ that the wetproofing is bad for the DBR mirror are used. Therefore, because moisture can be prevented being infiltrated, the device with high reliability can be obtained. When the resin molding is performed to the created device, and high temperature wetproof test is performed by the condition of 6° C. in temperature and 90% in humidity, extremely excellent results in which the lowering of an optical output after passing 5,000 hours is 0.5 dB or less can be obtained.

As described above vertical cavity-type semiconductor light-emitting device according to one embodiment of the present invention is characterized by comprising: a first semiconductor distributed Bragg reflector type mirror formed on a substrate; a first semiconductor layer formed on said first semiconductor distributed Bragg reflector type mirror and including at least an active layer which becomes an emission layer; a second semiconductor distributed Bragg reflector type mirror formed on the first semiconductor layer and including Al as a configuration element; and a second semiconductor layer including $In_xGa_{1-x}P$ ($0 \leq x \leq 1$) layer provided on said second semiconductor distributed Bragg reflector type mirror.

In above-mentioned configuration vertical cavity-type semiconductor light-emitting device, the $In_xGa_{1-x}P$ wetproof layer is located between the second semiconductor distributed Bragg reflector type mirror and the device surface. Therefore, the degradation by the moisture absorption is very little. Especially, since $In_xGa_{1-x}P$ layer does not include Al as a configuration element, and furthermore, five family element is only P, the effect is very high in the layer as wetproof layer. It is possible to make the device with higher reliability by thickening the thickness of the $In_xGa_{1-x}P$ layer enough when the emission wavelength is longer than the band gap wavelength of $In_xGa_{1-x}P$.

The preferred manners of the above-mentioned vertical cavity-type semiconductor light-emitting device are as follows.

(1) The second semiconductor distributed Bragg reflector type mirror includes a plurality of first layers and a plurality of second layers which are alternatively accumulated, and a final layer of said plurality of first layers in contact with said second semiconductor layer is a semiconductor layer including Al. The final layer of the DBR will be assumed to be AlGaAs, for example. However, since $In_xGa_{1-x}P$ which does not include Al is provided on the device surface side even such an ideal DBR configuration, the light-emitting device which is excellent in the wetproofing and high reliability can be obtained.

(2) An optical film thickness of sum of said final layer and said second semiconductor layer is an odd number times of ¼ wavelength of a resonance wavelength. The total optical film thickness of the final high refractive index layer of the second semiconductor distribution Bragg reflection type mirror and the semiconductor layer including $In_xGa_{1-x}P$ is the odd number times of ¼ wavelength of the resonance wavelength. Therefore, the surface of the device is located just in the antinode of the standing wave. Therefore, not only an excellent wetproofing is comprised by the $In_xGa_{1-x}P$ layer but also an optical output becomes sufficiently a high value.

(3) The second semiconductor layer includes a contact layer with the electrode and said contact layer is GaAs. The GaAs contact layer is provided on the surface of the device outside of the $In_xGa_{1-x}P$ wetproof layer. Therefore, the ohmic electrode of the low resistance can be provided. Especially, when the high-speed operation is required, since the device with low electronic resistance can be obtained even for the case of small ohmic-contact area suitable for low capacitance, this configuration is very effective.

(4) An ohmic electrode selectively provided to said contact layer; and a third semiconductor layer provided to surfaces contact layer except a part to which said ohmic electrode is provided is further provided. The GaAs contact layer is provided internally not on the final layer of the surface and the surface semiconductor layer is removed to the contact layer selectively only for the ohmic electrode formation part. With such a configuration, it is possible to arrange the GaAs contact layer at the position of the node of the standing wave formed with the optical resonator in the light emission part. It becomes possible to sufficiently reduce the influence of optical absorption with the GaAs contact layer even when the emission wavelength is the shorter wavelength than the band gap wavelength of GaAs.

The optical module, which comprises above mentioned each vertical cavity-type semiconductor light-emitting device, is characterized by comprising an ohmic electrode provided in the semiconductor layer, respectively, which includes said substrate and said $In_xGa_{1-x}P$ ($0 \leq x \leq 1$) layer, a lead connected with these ohmic electrodes and an resin envelope to expose at least a part of the lead and seal the vertical cavity-type semiconductor light-emitting device. Since the wetproofing of the semiconductor light-emitting device can be improved with the $In_xGa_{1-x}P$ layer, the envelope can be created by the resin molding. Therefore, the optical module using the vertical cavity-type semiconductor light-emitting device with reliability high, cheaper than the conventional one, can be made.

According to the present invention, the light-emitting device with extremely high reliability is obtained by providing the InGaP wetproof layer between the DBR mirror and the surface of the device in the vertical cavity-type semiconductor light-emitting device with the DBR mirror including a lot of Al which is degraded by the absorption of the moisture easily to the configuration element.

If the vertical cavity-type semiconductor light-emitting device of the present invention is used, very high reliability can be obtained even by a small and cheap module which uses the resin molding.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A vertical cavity-type semiconductor light-emitting device comprising:

a first semiconductor distributed Bragg reflector type mirror formed on a substrate;

a first semiconductor layer formed on said first semiconductor distributed Bragg reflector type mirror and including at least an active layer which becomes an emission layer;

a second semiconductor distributed Bragg reflector type mirror formed on the first semiconductor layer and including Al as a configuration element; and a second semiconductor layer including $In_xGa_{1-x}P$ ($0 \leq x \leq 1$) layer provided on said second semiconductor distributed Bragg reflector type mirror, wherein said second semiconductor distributed Bragg reflector type mirror is positioned between said second semiconductor layer and said first semiconductor layer.

2. The vertical cavity-type semiconductor light-emitting device according to claim 1, further comprising:

ohmic electrodes provided in the substrate and the second semiconductor layer, respectively;

a lead connected with said ohmic electrodes;

a resin envelope which exposes at least a part of said lead and seals said vertical cavity-type semiconductor light-emitting device.

3. The vertical cavity-type semiconductor light-emitting device according to claim 1, wherein said $In_xG_{1-x}P$ layer is used as a wetproof layer.

4. The vertical cavity-type semiconductor light-emitting device according to claim 1, wherein said second semiconductor layer includes a contact layer and said contact layer is GaAs.

5. The vertical cavity-type semiconductor light-emitting device according to claim 4 further comprising:

an ohmic electrode selectively provided to said contact layer; and a third semiconductor layer provided to surfaces of the contact layer except a part to which said ohmic electrode is provided.

6. The vertical cavity-type semiconductor light-emitting device according to claim 4, further comprising:

ohmic electrodes provided in the substrate and the second semiconductor layer, respectively;

a lead connected with said ohmic electrodes; and a resin envelope which exposes at least a part of said lead and seals said vertical cavity-type semiconductor light-emitting device.

7. The vertical cavity-type semiconductor light-emitting device according to claim 1, wherein said second semiconductor distributed Bragg reflector type mirror includes a plurality of first layers and a plurality of second layers which are alternatively accumulated, and the optical film thickness of a sum of a final layer of said plurality of first layers in contact with said second semiconductor layer and said second semiconductor layer is an odd multiple of ¼wavelength of a resonance wavelength.

8. The vertical cavity-type semiconductor light-emitting device according to claim 7, further comprising:

ohmic electrodes provided in the substrate and the second semiconductor layer, respectively;

a lead connected with said ohmic electrodes;

a resin envelope which exposes at least a part of said lead and seals said vertical cavity-type semiconductor light-emitting device.

9. The vertical cavity-type semiconductor light-emitting device according to claim 7, wherein said second semiconductor layer includes a contact layer with the electrode and said contact layer is GaAs.

10. The vertical cavity-type semiconductor light-emitting device according to claim 9, further comprising:

an ohmic electrode selectively provided to said contact layer; and a third semiconductor layer provided to surfaces contact layer except a part to which said ohmic electrode is provided.

11. The vertical cavity-type semiconductor light-emitting device according to claim 9, further comprising:

ohmic electrodes provided in the substrate and the second semiconductor layer, respectively;

a lead connected with said ohmic electrodes;

a resin envelope which exposes at least a part of said lead and seals said vertical cavity-type semiconductor light-emitting device.

12. The vertical cavity-type semiconductor light-emitting device according to claim 1, wherein said second semiconductor distributed Bragg reflector type mirror includes a plurality of first layers and a plurality of second layers which are alternatively accumulated, and a final layer of said plurality of first layers in contact with said second semiconductor layer is a semiconductor layer including Al.

13. The vertical cavity-type semiconductor light-emitting device according to claim 12, further comprising:

ohmic electrodes provided in the substrate and the second semiconductor layer, respectively;

a lead connected with said ohmic electrodes;

a resin envelope which exposes at least a part of said lead and seals said vertical cavity-type semiconductor light-emitting device.

14. The vertical cavity-type semiconductor light-emitting device according to claim 12, wherein said second semiconductor layer includes a contact layer and said contact layer is GaAs.

15. The vertical cavity-type semiconductor light-emitting device according to claim 14, further comprising:

an ohmic electrode selectively provided to said contact layer; and a third semiconductor layer provided to surfaces contact layer except a part to which said ohmic electrode is provided.

16. The vertical cavity-type semiconductor light-emitting device according to claim 14, further comprising:

ohmic electrodes provided in the substrate and the second semiconductor layer, respectively;

a lead connected with said ohmic electrodes;

a resin envelope which exposes at least a part of said lead and seals said vertical cavity-type semiconductor light-emitting device.

17. The vertical cavity-type semiconductor light-emitting device according to claim 12, wherein an optical film thickness of a sum of said final layer and said second semiconductor layer is an odd multiple of ¼ wavelength of a resonance wavelength.

18. The vertical cavity-type semiconductor light-emitting device according to claim 17, further comprising:

ohmic electrodes provided in the substrate and the second semiconductor layer, respectively;

a lead connected with said ohmic electrodes;

a resin envelope which exposes at least a part of said lead and seals said vertical cavity-type semiconductor light-emitting device.

19. The vertical cavity-type semiconductor light-emitting device according to claim 17, wherein said second semiconductor layer includes a contact layer with the electrode and said contact layer is GaAs.

20. The vertical cavity-type semiconductor light-emitting device according to claim 19, further comprising:

an ohmic electrode selectively provided to said contact layer; and a third semiconductor layer provided to surfaces of the contact layer except a part to which said ohmic electrode is provided.

21. The vertical cavity-type semiconductor light-emitting device according to claim 19, further comprising:

ohmic electrodes provided in the substrate and the second semiconductor layer, respectively;

a lead connected with said ohmic electrodes;

a resin envelope which exposes at least a part of said lead and seals said vertical cavity-type semiconductor light-emitting device.

* * * * *

UNITED STATES PATENT AND TRADEMARK OFFICE
CERTIFICATE OF CORRECTION

PATENT NO. : 6,653,660 B2
DATED : November 25, 2003
INVENTOR(S) : Takaoka

It is certified that error appears in the above-identified patent and that said Letters Patent is hereby corrected as shown below:

<u>Title page,</u>
Item [73], Assignee, should read:
-- [73]  Assignee: Kabushiki Kaisha Toshiba, Tokyo (JP) --

Signed and Sealed this

Seventeenth Day of February, 2004

JON W. DUDAS
*Acting Director of the United States Patent and Trademark Office*